United States Patent [19]

Dufour

[11] Patent Number: 5,363,065
[45] Date of Patent: Nov. 8, 1994

[54] FREQUENCY SYNTHESIZER UTILIZING A FAST SWITCHING CURRENT MIRROR CIRCUIT AND APPARATUS COMPRISING SUCH A SYNTHESIZER

[75] Inventor: Yves Dufour, St Lo, France

[73] Assignee: U.S. Philips Corporation, New York, N.Y.

[21] Appl. No.: 26,360

[22] Filed: Mar. 4, 1993

[30] Foreign Application Priority Data

Mar. 18, 1992 [FR] France .................. 92 03247

[51] Int. Cl.$^5$ .................. G05F 3/16; H03L 7/093
[52] U.S. Cl. .................. 331/17; 323/315; 330/288
[58] Field of Search .................. 331/17; 323/315, 316, 323/317; 330/257, 288

[56] References Cited

U.S. PATENT DOCUMENTS

| | | | |
|---|---|---|---|
| 4,059,808 | 11/1977 | Sakamoto et al. | 330/257 |
| 4,167,711 | 9/1979 | Smoot | 331/17 |
| 4,745,372 | 5/1988 | Miwa | 331/8 |

*Primary Examiner*—Andrew M. Dolinar
*Attorney, Agent, or Firm*—Leroy Eason

[57] ABSTRACT

Frequency synthesizer employing a current mirror circuit having a control branch which includes a transistor (T1) which is supplied by a control current source (S) operating in the switch mode. An improved decay time of the current mirror circuit is obtained by providing an additional transistor (TA) in parallel with the transistor (T1), having a fixed base bias voltage such that transistor (TA) is practically cut off when the control current source (S) supplies a nominal current and starts conducting when the control current is switched off. If the additional transistor (TA) is bipolar it is provided with an anti-saturation device, for example, a Schottky diode (18). It may, however, be a field effect transistor.

12 Claims, 4 Drawing Sheets

FREQUENCY SYNTHESIZER UTILIZING A FAST SWITCHING CURRENT MIRROR CIRCUIT AND APPARATUS COMPRISING SUCH A SYNTHESIZER

BACKGROUND OF THE INVENTION

1. Field of the Invention

The present invention relates to a frequency synthesizer utilizing a current mirror circuit which comprises, on the one hand, a control branch which includes in a series combination between a power supply terminal and a reference voltage terminal a control current source which may adopt two states, the first of which corresponding to a current value called nominal value and the second corresponding to a low current value or zero value, the main current path of at least one transistor, and a first balance resistor, and on the other hand, an output branch which comprises a second transistor, provided for producing a current whose value has a predetermined relation with the control current, and whose reference electrode is connected to the reference voltage terminal through a second balance resistor, the control electrode of the first and that of the second transistor being interconnected and biased with the control current.

2. Description of the Related Art

Frequency synthesizers utilizing a phase locked loop are widely used, especially for channel selection in radio-frequency transmission apparatus. An embodiment of a frequency synthesizer is described in U.S. Pat. No. 4,745,372. A mobile radio set may comprise such a synthesizer.

One of the various kinds of frequency synthesizer uses a circuit called charge pump which employs at least one current mirror circuit. There are a variety of embodiments of current mirror circuits of which the most simple is constituted by only two transistors, the transistor of the control branch being arranged as a diode. Another likewise well-known form uses three transistors, the common junction of the bases of the first and second transistors being fed by means of a third transistor, arranged as an amplifier, in the control branch of the current mirror circuit to supply power to the bases of the current mirror circuit.

According to either of these two simple embodiments, the output current of the current mirror circuit has a decay time which is relatively slow in its final portion, when the control current of the current mirror circuit is changed over from its nominal value to a zero value. This phenomenon is basically due to the discharging of the stray capacitance of the circuit, for example, that of the control current source. This discharging is effected across a base-emitter diode of a bipolar transistor or through the channel resistor of a field effect transistor whose impedance increases as the discharge current diminishes.

With respect to the charge pump circuit, it is known to be realised with two similarly constructed current sources and the current of one of them is applied to the capacitor after inversion by a current mirror circuit. When the charge voltage of the capacitor is stabilized, the algebraic sum of the currents supplied to the capacitor by the two switchable power sources is to be near to zero and the slowing down effect mentioned above, caused by the current mirror circuit, thus presents a major inconvenience to the stability of the charge voltage of the capacitor. This fault becomes manifest in a cyclic voltage variation which is equivalent to excessive noise in the phase locked control circuit.

SUMMARY OF THE INVENTION

Therefore, it is an object of the invention to improve the performance of a frequency synthesizer by reduction of the decay time of the output current of a current mirror circuit and, more particularly, in its final low-current part.

It is a further object of the invention to propose a solution for eliminating this difficulty, according to which the means used remain sufficiently simple and thus economic, for example, by avoiding having to use a separate switch control for these means, in parallel with the switching of the control current.

These objects are achieved according to the invention by a frequency synthesizer using a current mirror circuit and wherein in parallel with the main current path of the first transistor is connected the main current path of an additional transistor whose control electrode is biased with a fixed voltage determined in such a way that the additional transistor is almost cut off for the nominal value of the control current, and is conductive when the control current has a low or zero value.

The decrease of the output current in the circuit according to the invention is accelerated because when the first and second transistors become slightly conductive (and their internal impedance increases), it is the accelerating transistor that becomes conductive then and discharges through its main current path the load of the stray capacitance of the control current source. If one compares the decrease of the output current of the circuit according to the invention with that of a conventional current mirror circuit, the acceleration observed with the circuit according to the invention is all the more significant if the observation is made at a lower current level. Roughly speaking, one may compare the final reduction of the current in the circuit according to the invention with a linear function, whereas the decrease for which a conventional current mirror circuit is used would be of an asymptotic type. It will be understood that the change of state of the additional transistor directly follows from the voltage variation at the terminals of the first balance resistor.

To benefit more from this effect, the value of this first balance resistor is advantageously selected so that the voltage drop therein, under the influence of the nominal control current, exceeds 80 mV. In the case where bipolar transistors are used, for example, if a voltage drop of 150 mV is selected, the current deviated to the reference terminal by the additional transistor, is a negligible fraction (less than 1%) of the value of the nominal control current. When the control current is stabilized at zero, the additional transistor supplies, via its base-emitter junction, a current which is only a small fraction of the nominal control current, for example, 10% or less of this current. Therefore, the magnitude of the additional transistor may be selected smaller than that of the first and second transistors. Thus, the invention employs means which do not noticeably increase the semiconductor surface necessary for the circuit and is therefore economic.

In order not to influence the rise time of the circuit according to the invention, there is advantageously provided to let the additional transistor comprise an anti-saturation device such as a Schottky diode connected in parallel with the basecollector circuit of this additional transistor.

Another variant of an embodiment of the invention, also for the case where bipolar transistors are used, is characterized in that the anti-saturation device is constituted by a supplementary transistor having the same polarity as the other transistors, whose emitter is connected to the collector of the first transistor and to that of the additional transistor, whose base is biased with another fixed voltage which exceeds the previously mentioned fixed voltage by a fraction of a forward biased junction voltage, and whose collector is fed from the power supply terminal.

The invention is not restricted to the case where bipolar transistors are used. It may also be implemented with field effect transistors or also with a combination of bipolar transistors and field effect transistors, the latter, for example, being of the MOS type.

Thus, according to an advantageous embodiment of the invention, in which the current mirror circuit is realised with bipolar transistors, the frequency synthesizer is characterized, in that the additional transistor is a field effect transistor whose drain-source path is connected in parallel with the collector-emitter path of the first transistor.

Said determined fixed voltage may thus be simply supplied by another field effect transistor, whose drain and gate are interconnected and supplied with a fixed current from the power supply terminal, whereas the source of this other transistor is connected to the reference voltage terminal, said determined fixed voltage being available on the drain-gate junction of said other transistor.

BRIEF DESCRIPTION OF THE DRAWINGS

The following description with regard to the appended drawings, given by way of non-limiting examples, will make it better understood what the invention consists of and how it may be realised. In these drawings.

DESCRIPTION OF THE PREFERRED EMBODIMENTS

Figure 1:
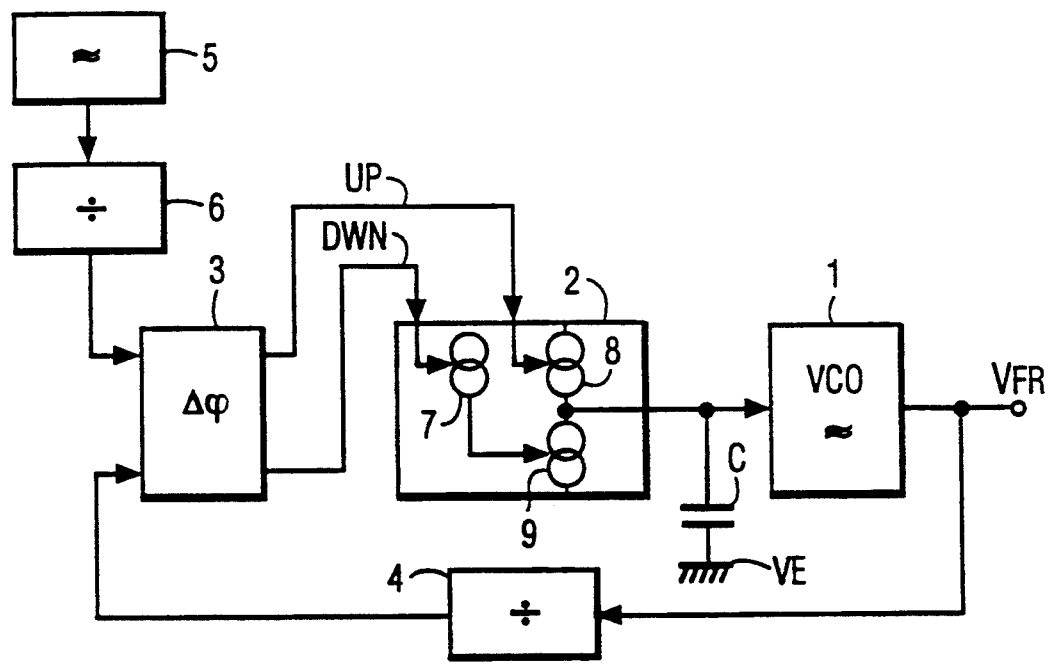
FIG. 1 shows a simplified diagram in the form of a block diagram of a frequency synthesizer.

An embodiment of a frequency synthesizer is briefly described with reference to FIG. 1. Therein an oscillator 1 whose frequency can be modified by a voltage Vv produces an output signal Vfr.

The voltage Vv is formed across the terminals of a capacitor C connected to ground ($V_E$) by means of a charge pump circuit 2, which receives a rise command (UP) and a decay command (DWN) coming from a phase comparator 3. To the two inputs of the phase comparator 3 are applied the output signal Vfr after being frequency-divided by a first divider 4, and also the signal produced by a reference oscillator 5 after being frequency-divided by a second divider 6.

The invention particularly (but not exclusively) applies to a frequency synthesizer in which the charge pump 2 comprises two similar current sources 7, 8, controlled by the respective time-modulated signals UP and DWN, and in which the direction of the output current of the current source 7 is reversed by a current mirror circuit 9 to realise the current absorption at the capacitor C.

In the following, more particularly the current mirror circuit 9 will be discussed which performs the discharging of the capacitor C.

Figure 2:
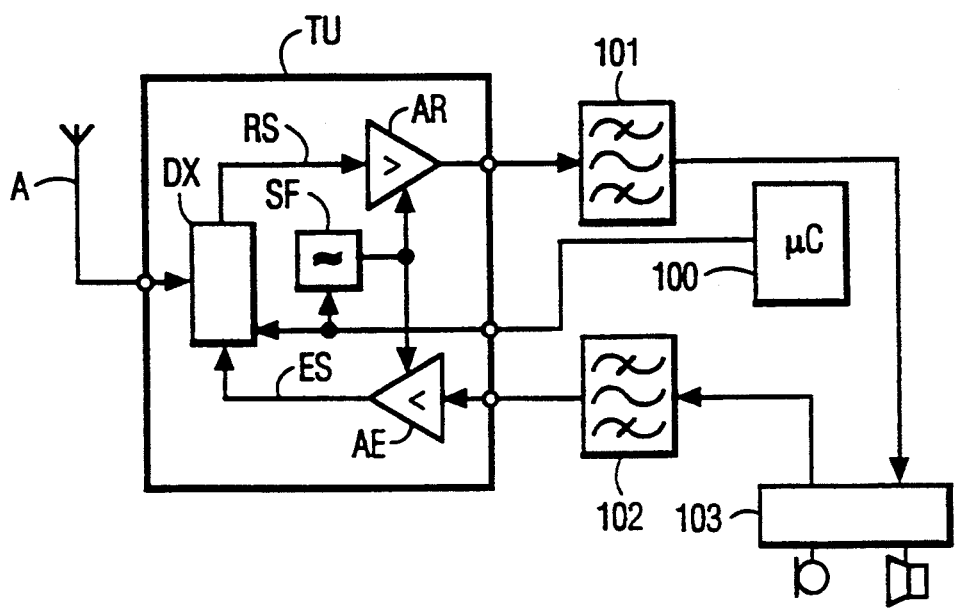
FIG. 2 shows a similar diagram concerning a mobile radio set.

FIG. 2 shows in a highly schematic manner in what way a frequency synthesizer is used in a mobile radio set.

An aerial signal A is applied to the input of a tuning circuit TU which comprises a multiplexer DX for separating received signals RS and transmission signals ES. The received signals RS are amplified and demodulated by a circuit AR assigned to the receiving end, whereas the transmission signals ES are produced at the output of an amplifier and signal shaping circuit AE assigned to the transmitting end.

The tuning circuit TU further includes a frequency synthesizer SF whose output signal is applied to the circuits AR and AE for the selection of receiving and transmitting channels respectively.

The radio set further includes a microprocessor 100 comprising control units (not shown, for example a keyboard) which microprocessor ensures the management of general functions of the set and, more particularly, the control of the frequency synthesizer SF and of the multiplexer Dx, as required. A filter 101 is inserted in the receiving channel between the circuit AR of the tuner TU and a microphoneloudspeaker audio circuit 103, and a filter 102 is inserted in the transmitting channel between the audio circuit 103 and the circuit AE of the tuner TU. In short, the frequency synthesizer SF produces signals Vfr whose frequency may be selected in a precise and certain manner in a spectrum of predetermined frequencies.

Figure 3:
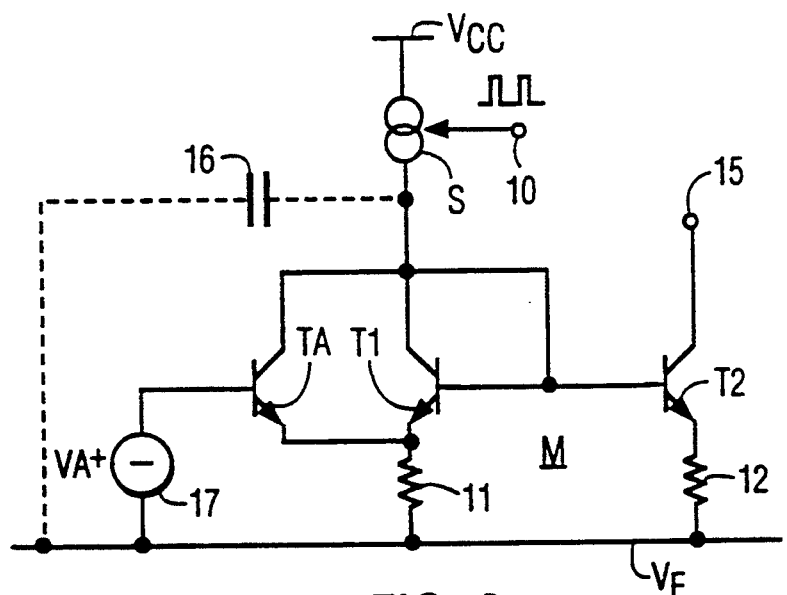
FIG. 3 shows an electric circuit diagram of a first embodiment of the current mirror circuit according to the invention in a version comprising bipolar transistors.

The circuit shown in FIG. 3 comprises a current mirror circuit M in accordance with the invention controlled from a control current source S which may adopt two states, the first state corresponding to a current value termed nominal current value and the second state to a current value which is practically zero. The control of this current source S is symbolized by the control terminal 10. A transistor T1 arranged as a diode, whose emitter comprises a first balance resistor 11 forms, together with the control current source S, the control branch of the current mirror circuit M connected in series between a power supply terminal VCC and a reference voltage terminal $V_E$. The output branch of the current mirror circuit M comprises a transistor T2 whose emitter is connected to the reference voltage $V_E$ through a second balance resistor 12. The transistors T1 and T2 have their bases interconnected, and the collector current of the transistor T2 constitutes at the output terminal 15 is the output of the current mirror circuit. Up to here the current mirror circuit M is of a fully conventional type in a change of the decay time, during which the control current source S from its high state to its low state, presents a significant slowing down in the range of low output currents. Actually, the junction between the control current source S and to the collector of the first transistor T1 has a stray capacitance 16 represented in a dashed line in the Figure, whose charge must be discharged mainly by the transistor T1 which is connected as a diode, which transistor has an impedance which continues to increase as the discharge current diminishes.

According to the invention the emitter-collector path of an additional transistor TA is connected in parallel with the emitter-collector path of the transistor T1, the base of transistor TA being biased relative to the reference terminal $V_E$ by a fixed voltage source 17 which has the value $V_A$. The voltage $V_A$ is selected such that the additional transistor TA is practically cut off when the control current source S supplies its nominal current, whereas this same additional transistor TA is conductive when, in contradistinction thereto, the control current source S is in its low state. This is easily realised by selecting the value of the first balance resistor 11 sufficiently high, so that the voltage drop across its terminals, produced by of the nominal current of the control current source S, is sufficiently high, that is to say, higher than 80 mV and, for example, of the order of 150 mV to differentiate well between the two operating states of the additional transistor TA. Thus, the voltage value $V_A$ of the voltage source 17 is selected near to a voltage drop of the junction voltage in forward direction, for example, 700 mV, so that the additional transistor TA is brought to a base-emitter voltage of only 550 mV (700-150) when the control current source S is in the conductive state (this transistor being thus slightly conductive), whereas when the control current source S is in its blocked state and the current passing through the first balance resistor 11 has considerably diminished, the additional transistor TA becomes conductive and supplies via its emitter a quiescent current as a result of a base-emitter voltage near to 700 mV (whilst the voltage drop in the balance resistor 11 is negligible). However, this quiescent current may be selected relatively small as required.

Worded differently, one may say that the transistors T1 and TA form a differential pair, the transistor TA having its base biased with a fixed voltage and the transistor T1 having its base biased with a decreasing voltage. When the current is decreasing due to the discharging of the stray capacitance 16, the base of the transistor T1 has a voltage which becomes less than the voltage of the base of transistor TA, and it is thus the transistor TA that becomes conductive and continues to discharge this stray capacitance.

Figure 4:
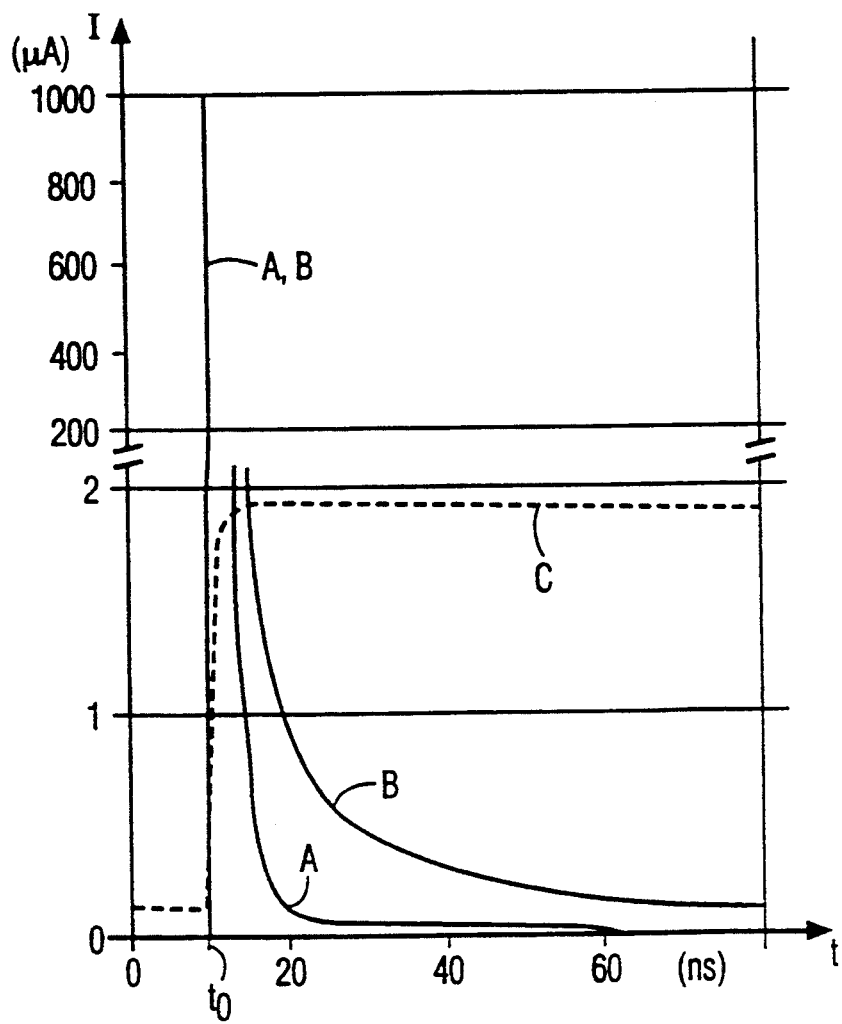
FIG. 4 is a diagram showing the variation with time of the output current of the circuit shown in FIG. 1 compared with the corresponding current variation in a prior-art current mirror circuit.

FIG. 4 shows for one embodiment the variation of the output current I available at the output terminal 15 plotted against time t from the instant to at which the control current source passes to its blocked state. The curve A represents the curve of this variation for the current mirror circuit in FIG. 3, whereas the curve B represents the behaviour of this decrease for such circuit when the additional transistor TA is omitted. One will notice in FIG. 4 that the first part of the decrease of the output current, represented on a small scale, is identical for the two circuits, which is no inconvenience because this first part of the decrease is rapid. The circuit according to the invention has a very distinct acceleration of the decay time in the final part having a low current, as represented on a large scale. The curve C indicated as a dashed line presents with time the behaviour of the current supplied by the additional transistor TA.

Figure 5:
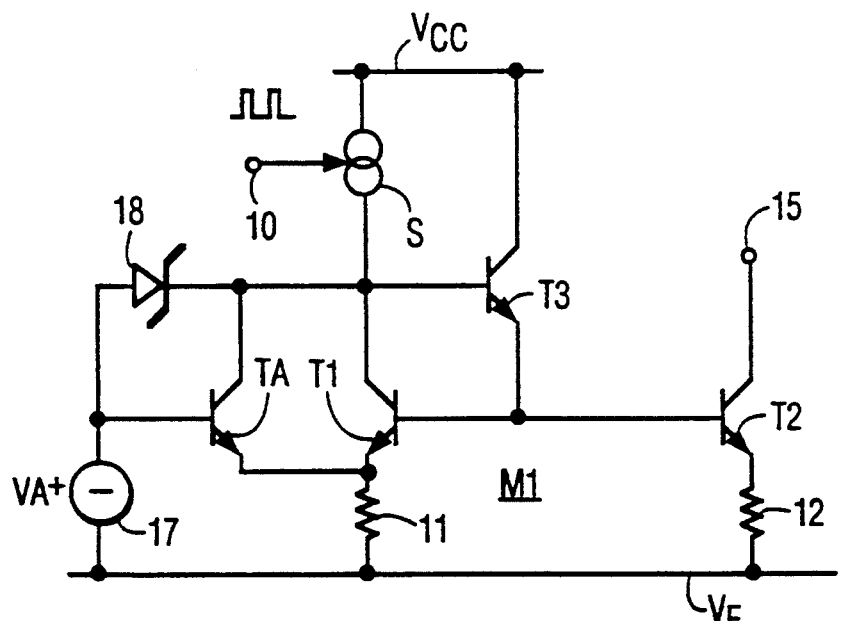
FIG. 5 shows the diagram of a second embodiment of the current mirror circuit according to the invention which comprises an anti-saturation device.

FIG. 5 shows the diagram of a second embodiment of the circuit according to the invention. In this drawing Figure the elements having like functions to those in the circuit shown in FIG. 3 carry like reference characters. The diagram of FIG. 5 is distinguished from that given in FIG. 3 with respect to the current mirror circuit M1 in that, as known per se, a third transistor T3 is inserted in the control branch of the current mirror circuit M1, an feeds via its emitter the two bases of the transistors T1 and T2. Similarly to the first FIG. 3 embodiment, an additional transistor TA has its emitter-collector path connected in parallel with the emitter-collector path of the first transistor T1. The base of the additional transistor TA is also biased with a fixed voltage $V_A$. The effect of acceleration obtained with this arrangement is similar to the effect obtained with the arrangement in FIG. 4.

In the embodiment shown in FIG. 5 the additional transistor TA has an anti-saturation device constituted by a Schottky diode 18 connected between the base and the collector of said transistor, in a direction so that the diode inhibits the collector voltage of this transistor from reaching the voltage of its emitter. An anti-saturation device of the additional transistor TA may be useful, depending on its applications, for avoiding a delay in the rise time of the controlled current mirror circuit due to the saturation of transistor TA and the delay in the discharging of the loads thus accumulated in this transistor. The anti-saturation device does not exert any influence on the decay time of the current mirror circuit M1.

Figure 6:
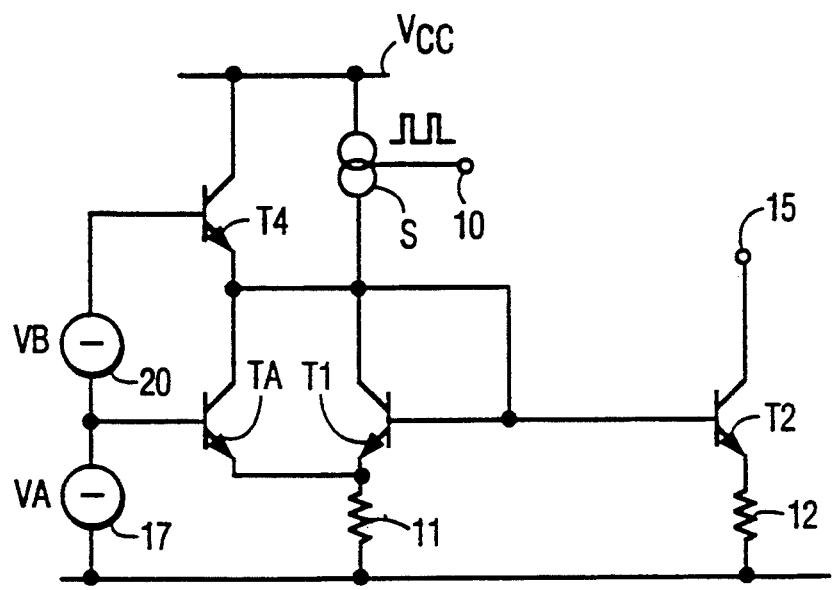
FIG. 6 gives the diagram of a third embodiment of the current mirror circuit according to the invention, also comprising an anti-saturation device.

FIG. 6 shows a third embodiment of the circuit according to the invention, in which another type of anti-saturation device is applied in a circuit such as the one shown in FIG. 3. It is constituted by a supplementary transistor T4 whose emitter is connected to the combined collectors of the additional transistor TA and the first transistor T1, whose collector is connected to the supply voltage Vcc and whose base is biased with a fixed voltage which slightly exceeds the voltage $V_A$ of the preceding embodiments, for example, by means of a voltage generator $V_B$ 20 of 200 mV, which voltage is equivalent to only a fraction of a forward biased junction voltage. The generator 20 of the voltage $V_B$ and the transistor T4 form an anti-saturation device for the additional transistor TA by imposing a collector-emitter voltage limit of the transistor TA which substantially corresponds to the value of the voltage $V_B$. In both the anti-saturation device of FIG. 5 and FIG. 6, the common junction of the collectors of the transistors TA and T 1 is incapable of decreasing to the value of the reference voltage $V_E$, but it is the additional transistor TA that supplies power at the end of the discharging operation, whereas the first transistor T1 as well as its counterpart transistor T2 in the current mirror circuit do not supply power, The voltage generators $V_A$ and $V_B$ may be realised in a very simple manner: the generator $V_A$ can be constituted, for example, by a transistor arranged as a diode, supplied in forward direction with current by a current source from the supply terminal VCC, whereas the voltage generator $V_B$ can be a resistor having an appropriate value, inserted in series between the generator $V_A$ and said current source.

The embodiments described thus far use bipolar transistors. However, the invention also includes the use of field effect transistors, for example, having blocking gates, with which similar results can be obtained. A particularly advantageous form of such an embodiment is described with reference to FIG. 7, of which the diagram shows the use of bipolar transistors to realise the current mirror circuit, which are combined with blocking-gate field effect transistors (MOS) to realise the function of accelerating the decay time of the current mirror circuit.

Figure 7:
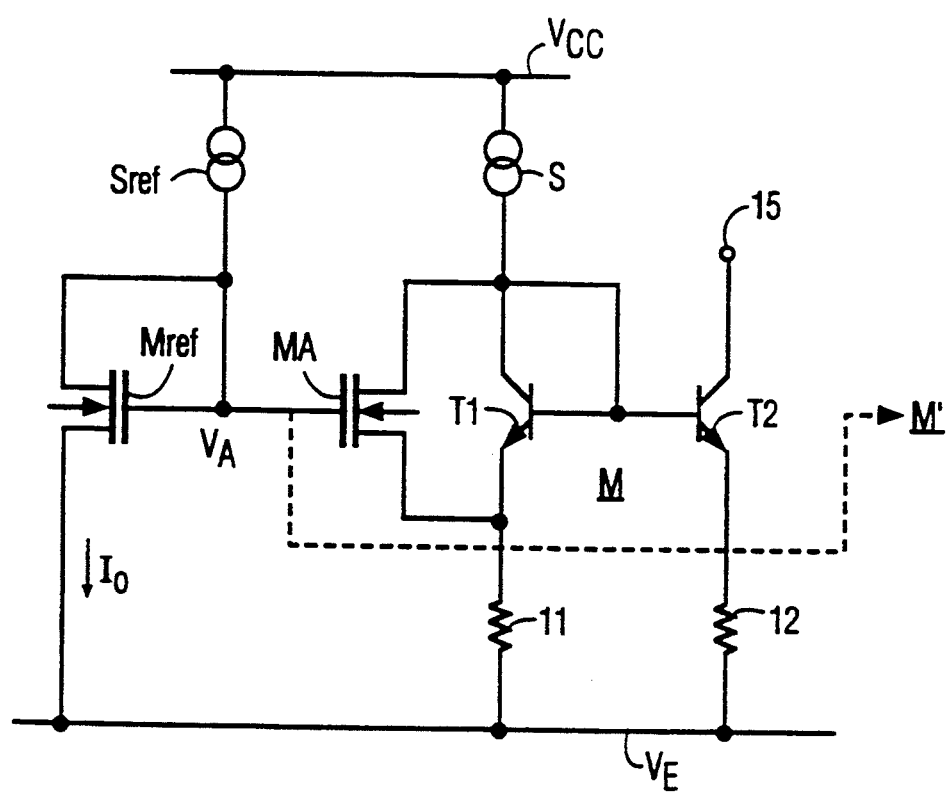
FIG. 7 shows the diagram of a fourth embodiment of the current mirror circuit according to the invention in a mixed version including bipolar transistors and field effect transistors.

In FIG. 7 the current mirror circuit M is constituted by like elements to those represented in FIG. 3, which are denoted by like reference characters. The transistor termed the additional transistor is here an n-channel transistor MA of the MOS type, whose drain-source path is connected in parallel with the collector-emitter path of the first transistor T1. To realise the fixed voltage $V_A$ necessary for biasing the gate of the additional transistor MA, another transistor Mref of the same type as transistor MA is provided, whose source is connected to the reference voltage $V_E$, whose gate and drain are interconnected and supplied with the supply voltage Vcc by a current source Sref supplying a fixed current Io.

The drain-gate junction of the transistor Mref provides the sought voltage $V_A$ which is applied to the gate of the additional transistor MA. Since the conductance of an MOS transistor is not as high as that of a bipolar transistor, it is useful to increase the value of the balance resistors 11 and 12 considerably to obtain results which are equivalent to those of the preceding embodiments, in which only bipolar transistors are employed.

This assembly presents various advantages. The additional transistor MA is not subject to saturation. Also, the control of the gate of the additional transistor MA is effected without current consumption. It is thus possible to control by a single transistor Mref a plurality of current mirror circuits which are capable of operating in parallel, for absorbing the high currents in the charge pump circuit. This possibility has been symbolically represented by the dashed line for the control of at least one supplementary current mirror circuit M'. Obviously, an additional transistor such as transistor MA is associated with each of these current mirror circuits M'.

The circuits described with respect to the FIGS. 3 to 7 advantageously apply to the realisation of a charge pump in a phase-locked loop of a frequency synthesizer. In such an application two cyclically controlled current sources have the task of controlling a predetermined charge voltage on the terminals of a capacitor. These two cyclically controlled current sources are structured in identical manner so as to obtain currents which have the same rise time and decay time. The current of one of these current sources is returned with the inverse sign by means of a current mirror circuit. By means of the invention, a current whose decay time is practically identical with the decay time of the current source opposite thereto is restored at the output of the current mirror circuit. Thus, the voltage fluctuation at the terminals of the capacitor, which fluctuation occurs in the absence of the embodiments of the invention and has a sawtooth shape, is practically eliminated.

In the embodiments described hereinbefore all the bipolar transistors are of the npn type and the MOS transistors have n channels. It will be evident that the invention also applies to a circuit in which transistors of opposite type are used for which the supply terminals are sign inverted.

Since the invention can be arbitrarily used with bipolar transistors or field effect transistors, it will be understood that for this reason the expression "main current path" denotes the collector-emitter path of a bipolar transistor or the drain-source path of a field effect transistor, whereas "control electrode" is meant to denote the base of a bipolar transistor or the gate of a field effect transistor, and the expression "reference electrode" designates the emitter of a bipolar transistor or the source of a field effect transistor.

Other possible modifications with respect to the embodiments described nevertheless remain within the scope of the invention to be claimed hereinafter.

I claim:

1. A current mirror circuit having a power supply terminal ($V_{cc}$) and a reference voltage terminal ($V_c$) and which comprises:
   a control branch which includes, connected in series between the power supply terminal and reference terminal,
   a control current source for producing a control current which may be switched to either a preset value or a nominal zero value;
   the main current path of a first transistor (T1) having a control electrode and reference electrode; and
   a first balancing resistor connecting the reference electrode of the first transistor to the reference voltage terminal;
   an output branch which includes a second transistor (T2) for producing an output current of a value in predetermined relation with the value of said control current, said second transistor having a control electrode and a reference electrode, the reference electrode thereof being connected to said reference voltage terminal by a second balancing resistor;
   the control electrodes of the first and second transistors being interconnected together and coupled to said current source, and biassed by said control current so that each of said transistors is conductive when the control current has said preset value but becomes substantially non-conductive when the control current is switched to said nominal zero value thereof; and
   a third transistor (TA,MA) having a current path connected in parallel with the main current path of said first transistor, said third transistor having a control electrode which is biassed to a fixed bias voltage such that the third transistor is substantially non-conductive when said first transistor is conductive but becomes conductive when said first transistor becomes substantially non-conductive.

2. A current mirror circuit as claimed in claim 1, wherein when said control current has said preset value thereof the current in the main current path of said first transistor produces in said first balancing resistor a voltage drop exceeding 80 mV.

3. A current mirror circuit as claimed in claim 1, wherein said third transistor is bipolar and further comprising means for preventing saturation of said third transistor.

4. A current mirror circuit as claimed in claim 3, wherein said means for preventing saturation is a Schottky diode connected between the base and collector of said third transistor.

5. A current mirror circuit as claimed in claim 3, wherein said first transistor is bipolar, said means for preventing saturation is a fourth transistor (T4) which is bipolar, the emitter of said fourth transistor is connected to the collectors of both the first and third transistors, the collector of the fourth transistor is connected to said power supply terminal, and the base of the fourth transistor is biased to a fixed bias voltage which exceeds the fixed bias voltage of said third transistor.

6. A current mirror circuit as claimed in claim 1, wherein said first and second transistors are bipolar transistors and said third transistor is a field effect transistor (MA).

7. A current mirror circuit as claimed in claim 6, further comprising a fourth transistor ($M_{ref}$) for supplying said fixed bias voltage of said third transistor, said fourth transistor being a field effect transistor having a gate and two main terminals, the gate and a first of the main terminals of said fourth transistor being interconnected and coupled to said power supply terminal, a second of the main terminals of said fourth transistor being connected to said reference voltage terminal, said fixed bias voltage of said third transistor being available at the gate of said fourth transistor.

8. A frequency synthesizer comprising a current mirror circuit as claimed in claim 1.

9. A current mirror circuit as claimed in claim 2, wherein said third transistor is bipolar and further comprising means for preventing saturation of said third transistor.

10. A current mirror circuit as claimed in claim 9, wherein said means for preventing saturation is a Schottky diode connected between the base and collector of said third transistor.

11. A current mirror circuit as claimed in claim 9, wherein said first transistor is bipolar, said means for preventing saturation is a fourth transistor (TA) which is bipolar, the emitter of said fourth transistor is connected to the collectors of both the first and third transistors, the collector of the fourth transistor is connected to said power supply terminal, and the base of the fourth transistor is biased to a fixed bias voltage which exceeds the fixed bias voltage of said third transistor.

12. A current mirror circuit as claimed in claim 2, wherein said first and second transistors are bipolar transistors and said third transistor is a field effect transistor.

* * * * *